United States Patent [19]

Spielman

[11] Patent Number: 5,548,255
[45] Date of Patent: Aug. 20, 1996

[54] COMPACT DIPLEXER CONNECTION CIRCUIT

[75] Inventor: Mark A. Spielman, South Norwalk, Conn.

[73] Assignee: Microphase Corporation, Norwalk, Conn.

[21] Appl. No.: 494,279

[22] Filed: Jun. 23, 1995

[51] Int. Cl.$^6$ .................................................. H03H 7/46
[52] U.S. Cl. ........................... 333/132; 333/134; 333/185; 333/246; 455/5.1; 455/6.2
[58] Field of Search .................................... 333/126, 129, 333/132, 134, 185; 455/5.1, 6.1, 6.2; 370/37

[56] References Cited

U.S. PATENT DOCUMENTS

| | | | |
|---|---|---|---|
| 3,069,635 | 12/1962 | Eickhoff | 333/126 |
| 3,733,608 | 5/1973 | McGhay et al. | 333/132 X |
| 5,027,426 | 6/1991 | Chiocca, Jr. | 455/5.1 |

FOREIGN PATENT DOCUMENTS 24026  2/1977  Japan .................................... 333/132

*Primary Examiner*—Paul Gensler
*Attorney, Agent, or Firm*—Perman & Green

[57] ABSTRACT

A diplexer constructed on a stripline board includes a plurality of filters each having a series of filter sections providing an elongated physical configuration to the respective filter. Each filter section comprises an inductor and a capacitor. Each of the capacitors for each of the filters is formed in stripline format by laminating a pad of electrically conductive material to a sheet of electrically conductive material with the interposition of a layer of dielectric material between the pad and the sheet. Each inductor is formed as a coil wound about a core of air or solid magnetizable material. To provide for reduced physical size of the circuitry, thereby to accommodate emplacement of the circuitry within a television cable connection box, there is provided in a preferred embodiment of the invention filters of higher and lower frequency channels wherein the filter of the lower frequency channel has larger inductors. The lower frequency channel is bent to reduce overall size, the bending bringing distant inductors in close proximity. To reduce mutual coupling between the distant inductors, the inductors are arranged with mutually perpendicular orientations of their respective axes. Power combiners, power splitters, and relays are also included in the circuitry for provision of both incoming and outgoing telephony and television video signals.

8 Claims, 4 Drawing Sheets

COMPACT DIPLEXER CONNECTION CIRCUIT

BACKGROUND OF THE INVENTION

This invention relates to diplexers suitable for use with addressable converters of television sets for reception of cable television programs, plus reception of telephony and transmission of telephony as well as transmission of signals by a cable for interactive television. More specifically, the invention relates to an arrangement of circuit components including inductors and capacitors of channel filters mounted on a stripline board, enabling a reduction of overall physical size of the diplexer while retaining isolation between transmit and receive channels.

Addressable converters are widely used in the television interconnect boxes by which cable communication is connected to a television set in a person's home. Typically, a cable will carry numerous television programs in different frequency bands, and the converter performs the function of selecting a desired one of the frequency bands to be converted to the frequency of a specific one of the channels of the television set which is designated for reception of the cable programs.

This is an important function for the interconnection box, namely, the inputting of cable television program material to the television receiver. However, it is recognized today that telephony can also be communicated via the cable, and technology is advancing to provide for two-way transmission of telephony communication via cable wherein the telephony would occupy a specific transmit band and a specific receive band. Also, to handle the increased interest in interactive television, it is desirable to provide for an outgoing transmission link to carry signals suitable for interactive response. Accomplishing also the functions of receiving and transmitting audio-visual signals requires a channel via cable communication to fully utilize the interactive capacity of the audiovisual equipment.

Thus, it is apparent that the cable interconnection box for a home television set need provide four different functions, namely, reception of video images, transmission of interactive response signals, reception of telephony signals, and transmission of telephony signals. Such functions require the use of a diplexer enabling the connection of transmission and reception channels operative at different frequencies to a common terminal whereby a connection is made to a cable. Furthermore, the channels require filters to ensure adequate isolation between relatively high amplitude transmitted signals and relatively low amplitude received signals. In addition, it is understood that certain services may be subscribed for by a person to the exclusion of other services. Accordingly, relays need be provided within the circuitry for activating and deactivating such services. The relevant frequency bands are below one gigahertz in frequency and, accordingly, it is contemplated that such circuitry would be constructed primarily of discrete components, while some portions may be constructed from distributed components.

A problem arises in that the construction of a connection box with all of the requisite components of the foregoing filters of a diplexer may require a physical volume larger than that which is convenient for utilization within a television cable connection box. An attempt at reduction of physical space by a close positioning of the electrical components may result in cross talk between channels and coupling within a channel, both of which impair the operation of the circuitry. In addition, there is a requirement for manufacturing that the layout of the electrical components must be such as to facilitate manufacture. Presently available circuitry for use in television cable connection boxes does not provide all of the foregoing features.

SUMMARY OF THE INVENTION

The aforementioned problem is overcome and other advantages are provided by a construction of diplexer connection circuit, in accordance with the invention, wherein the diplexer function is provided by two multiple-section filters connected to a common input/output terminal with a first one of the filters providing a channel for higher frequency signals, such as incoming television and telephony signals, and with a second one of the filters providing a channel for lower frequency signals, such as outgoing response signals for interactive cable television and outgoing telephony signals. The multiplicity of filter sections, which include both discrete inductive and capacitive components, results in an elongated configuration to each of the filters.

In order to provide the circuitry within the physical space required to house the diplexer, at least one of the filters, for example the lower frequency filter, is bent or folded resulting in the bringing into proximity of two filter sections which would be distantly spaced in the linear physical configuration of the filter. Capacitors of the filter are formed in a generally stripline format such as by use of electrically conductive pads supported via an insulating layer of dielectric material upon an electrically conductive sheet at the stripline. This facilitates manufacture. The inductors are formed by winding electrically conductive wire about a core of air or solid magnetizable material wherein the magnetic vector is aligned with an axis or centerline of the core.

As a result of the bending or folding of the filter, it becomes necessary to counteract the increased mutual coupling between inductors which are distant in the linear configuration of the filter, but have become proximate by the bending or folding. The proximate inductors are oriented with their magnetic axes perpendicular to each other, thereby to minimize any increase in the mutual coupling. The filters are located in separate sections of a plate of the stripline, thereby to reduce coupling and interference between the filters. The physical separation between filters, and the differing orientations of inductors of a folded filter permit normal operation of the filters even in the case of relatively strong outgoing signals and a relatively weak incoming signal. Approximately a 150:1 frequency ratio exists between the incoming and the outgoing signals.

The foregoing arrangement of the components permits the circuitry to be fabricated within a space less than approximately one-half wavelength of the shortest wavelength of the signals. Furthermore, the capacitors and the interconnecting lines of each of the filers can be constructed by the usual fabrication techniques employed in stripline construction. Thereafter, the coils are positioned automatically by coil positioning equipment. There is adequate surface area for affixing and soldering the terminals of the respective coils.

In a preferred embodiment of the invention, in order to join outgoing telephony signals with outgoing interactive signals, a circuit combiner constructed of a plurality of Balun cores is employed. For separation of a received telephony signal from a received television signal, the preferred embodiment employs a distributed component in the form of a microwave hybrid coupler in stripline format wherein a portion of the incoming signal power is extracted and filtered to obtain the incoming telephony signal. Relays for selectively switching in or switching out television reception/transmission features are located within a central portion of the stripline board so as to enhance separation of the various circuit functions. This improves isolation between various portions of the circuitry. Thereby, the construction of the circuitry in accordance with the invention enables manufacture to be accomplished readily; the circuitry can be placed within reduced physical space of the connection box; and suitable isolation between the various circuit channels is attained to ensure a high fidelity of signal reception and transmission.

BRIEF DESCRIPTION OF THE DRAWING

The aforementioned aspects and other features of the invention are explained in the following description, taken in connection with the accompanying drawing figures wherein.

Identically labeled elements appearing in different ones of the figures refer to the same element in the different figures but may not be referenced in the description for all figures.

DETAILED DESCRIPTION

Figure 1:
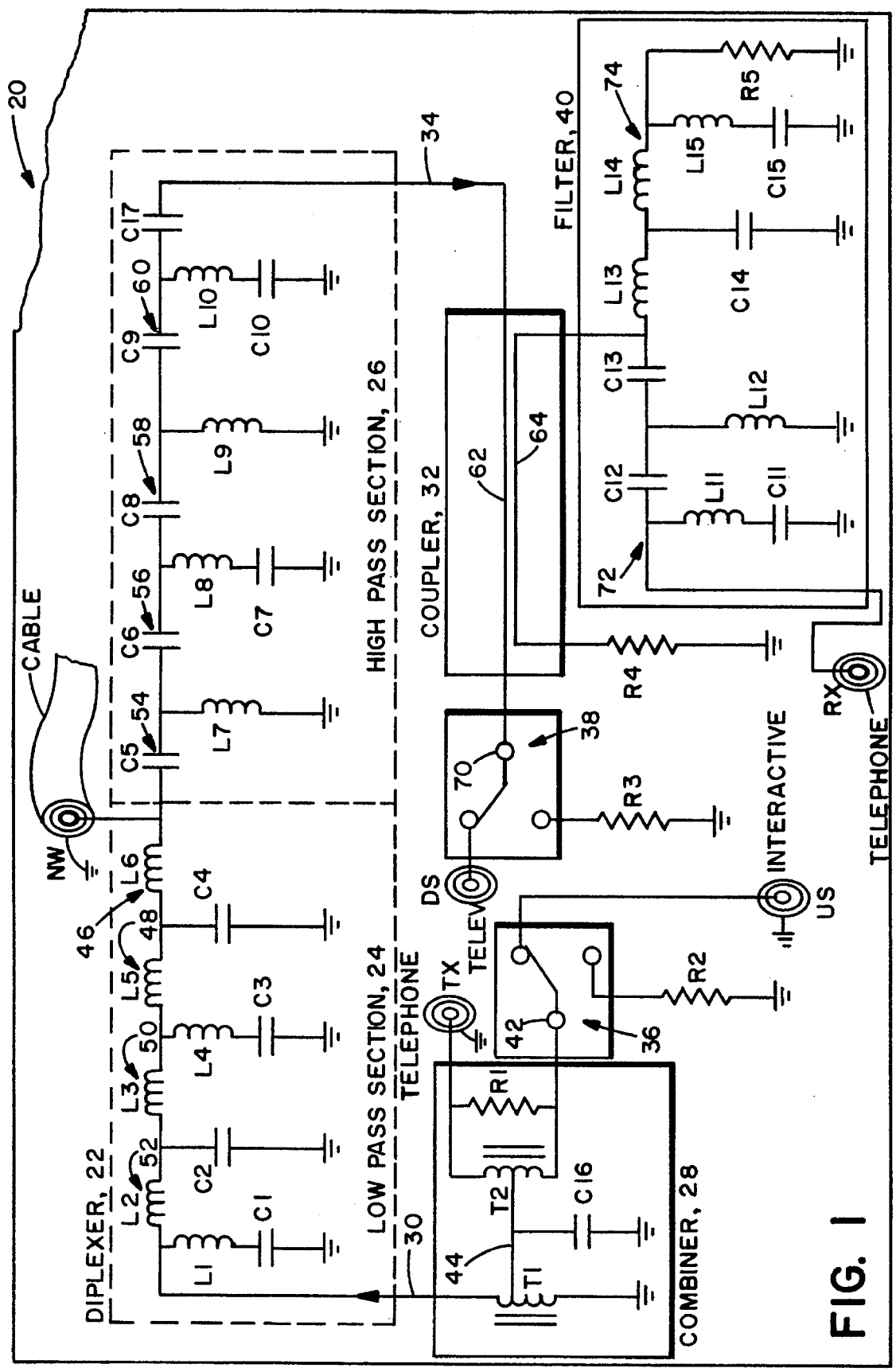
FIG. 1 is a schematic diagram of a cable connection circuit incorporating a construction of the invention.

FIG. 1 shows a schematic diagram of a cable connection circuit 20 suitable for use in connecting interactive television plus two-way telephony from within a house to the cable of a cable communication system. The cable is connected to terminal NW of the circuit 20. Also included within the circuit 20 is a terminal DS for reception of incoming television signals, a terminal RX for reception of incoming telephone signals, a terminal US for outputting television video-type signals for interactive communication, and a terminal TX for outputting telephone signals. The circuit 20 comprises a diplexer 22 having a low-pass filter section 24 for outgoing signals applied to the terminal NW, and a high-pass filter section 26 for incoming signals received at the terminal NW. Also included in the circuit 20 is a combiner 28 connecting with an input line 30 of the low pass filter section 24, a microwave coupler 32 connecting with an output line 34 of the high-pass filter section 26, two relays 36 and 38, and a filter assembly 40. Each of the terminals NW, RX, DS, TX, and US are coaxial terminals having inner conductors which carry the signals and outer conductors which are grounded.

Figure 2:
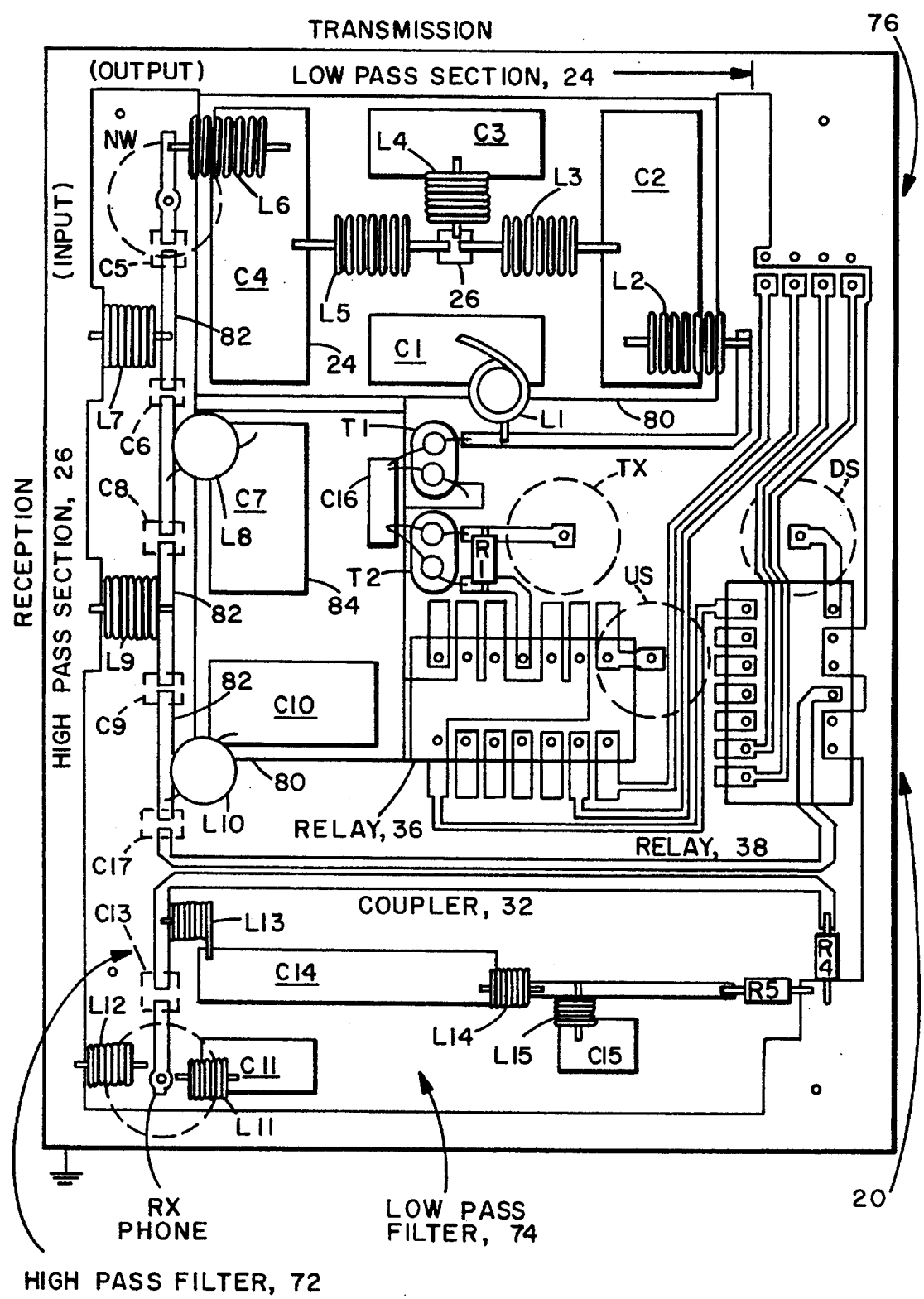
FIG. 2 shows a layout of components of the circuit in a stripline and a microstrip configuration.

The combiner 28 has two input terminals, one of which is the terminal TX, and the other of which is a pole 42 of the relay 36. The relay 36 is operative to connect the pole 42 to the terminal US, or alternatively, to ground the pole 42 via a resistor R2. The resistor R2 presents an impedance, such as 75 ohms by way of example, to equal the impedance of a line (not shown) connected to the terminal US. The relay 36 includes a coil (not shown) which is operated by a signal from a remote station (not shown) for selectively enabling or disabling communication via the terminal US. The combiner 28 is operative for combining signals of the terminals TX and US for transmission via the line 30 to the diplexer 22 for communication via the cable connected to the terminal NW. The combiner 28 comprises two transformers T1 and T2, a resistor R1, and a capacitor C16. The outboard terminals of the transformer T1 connect respectively to the line 30 and to ground. The outboard terminals of the transformer T2 connect to terminals of the resistor R1, and are connected further respectively to the terminal TX and to the relay pole 42. The transformer T1 includes a tap and the transformer T2 includes a tap, the taps of the transformers T1 and T2 being connected together via a node 44. The capacitor C16 connects between the node 44 and ground. As shown in FIG. 2, the capacitor C16 has a relatively small size so as to have no more than a minor effect on the electrical operation of the combiner 28, the capacitor C16 serving essentially as a mounting support for electrical connection of the transformers T1 and T2.

In the diplexer 22, the low-pass filter section 24 comprises a plurality of filter stages 46, 48, 50, and 52 interconnected serially between the terminal NW and the line 30. The filter section 24 comprises six inductors L1–L6 and four capacitors C1–C4 wherein each of the filter stages 46–52 comprises one of the capacitors and at least one of the inductors. Thus, the filter stage 46 comprises the inductor L6 and the capacitor C4, the filter stage 48 comprises the inductors L4 and L5 and the capacitor C3, the filter stage 50 comprises the inductor L3 and the capacitor C2, and the filter stage 52 comprises the inductors L1 and L2 and the capacitor C1. The line 30 connects with a node at the junction of L1 and L2.

The high-pass filter section 26 comprises a series of filter stages 54, 56, 58, and 60 which are connected serially one to the other. The filter section 26 comprises six capacitors C5–C10 and four inductors L7–L10 wherein each of the filter stages 54–60 comprises one of the inductors and at least one of the capacitors. Thus, the filter stage 54 comprises the capacitor C5 band the inductor L7, the filter stage 56 comprises the capacitors C6 and C7 and the inductor L8, the filter stage 58 comprises the capacitor C8 and the inductor L9, and the filter stage 60 comprises the capacitors C9 and C10 and the inductor L10. A node at the connection of the capacitor C9 with the inductor L10 is coupled via a coupling capacitor C17 to the microwave coupler 32.

It is noted that the arrangement of the series of filter stages of the low-pass section 24 is, in essence a mirror image of the arrangement of the series connection of the filter stages of the high-pass section 26 such that an inductor of the low-pass section 24 is substituted for a capacitor of the high pass section 26. The low-pass filter section 24 is operative to pass the relatively low frequency band of the outgoing signals while attenuating the higher frequency incoming signals. The high pass filter section 26 is operative to pass the relatively high frequency band of incoming signals while attenuating the lower frequency outgoing signals. The methodology for selecting component values for the inductors and the capacitors of the low-pass section 24 and the high pass section 26 is well-known so as to provide a desired pass band and attenuation characteristics for each of the sections 24 and 26. Accordingly, the selection of the suitable component values need not be described in detail herein for an understanding of the invention.

Figure 4:
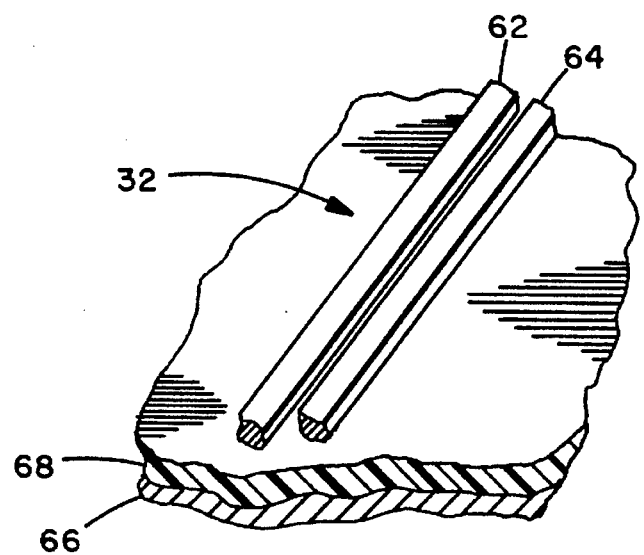
FIG. 4 is a fragmentary view of the cable connection circuit showing a microwave coupler thereof.

The microwave coupler 32, as shown in FIG. 4, is composed of stripline conductors 62 and 64 spaced apart from a bottom electrically conductive sheet 66 by an insulating dielectric support plate 68. The conductors 62 and 64 are spaced apart with a spacing suitable for providing a desired amount of coupling, as is well known in the construction of such microwave couplers. As shown in FIG. 1, the conductor 62 extends from the line 34 to a pole 70 of the relay 38. The conductor 64, at an end thereof facing the relay 38, is terminated by a resistor R4 connected to ground. The conductor 64, at an opposite end thereof, connects to the filter assembly 40.

The relay 38 includes a coil (not shown) energized by a signal from a remote location to select alternatively the terminal DS connected via the pole 70, or to ground the pole 70 via a resistor R3. The resistance value of the resistor R3 provides for an impedance termination to the coupler 32 which is the same as the impedance of a coaxial line (not shown) connected to the terminal DS for reception of television programs, the resistance having a value of 75 ohms, by way of example. Similarly, the value of the resistor R4 is set to 75 ohms so as to equal the value of the resistor R3, this being equal also to the characteristic impedance of the transmission line of the microwave coupler 32.

The filter assembly 40 comprises a high-pass filter 72 and a low-pass filter 74, the latter being terminated with a resistor R5. The high-pass filter 72 comprises three capacitors C11–13 and two inductors L11–L12 which are arranged in two filter stages connected serially, a first of the two filter stages comprising the capacitor C13 and the inductor L12, while the second of the filter stages comprises the capacitors C11 and C12 and the inductor L11. A node at the interconnection between the capacitor C12 and the inductor L11 connects with the terminal RX. In the low-pass filter 74, there are three inductors L13–L15, and two capacitors C14 and C15. The filter 74 is arranged in two stages, wherein a first of the stages comprises an inductor L13 and the capacitor C14, and the second of the two stages comprises the inductors L14 and L15 and the capacitor C15. A node at the connection between the inductors L14 and L15 is connected to ground by the resistor R5. In the filter assembly 40, the high pass filter 72 is used for passing signals to the telephone via terminal RX while the low pass filter 74 with its terminating resistor R5 is used only as an impedance match which, in combination with the impedance presented by the high pass filter 72, matches the impedance at the output port of the microwave coupler 32 at the end of the conductor 64 connecting to the filter assembly 40.

Figure 3:
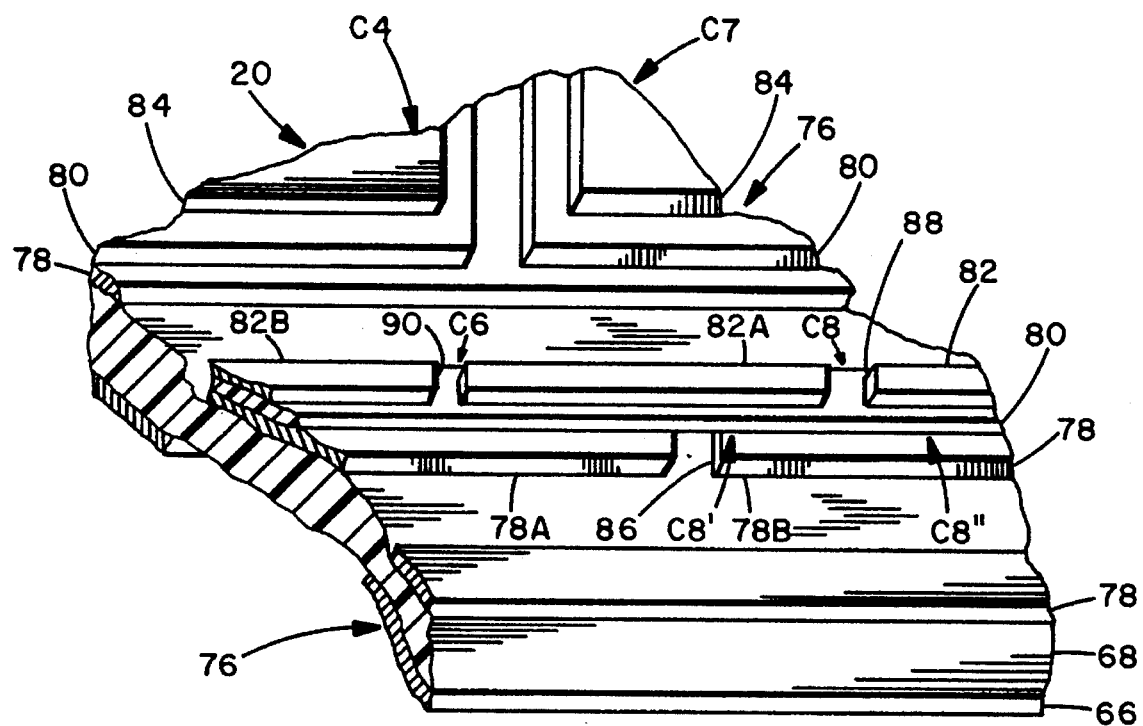
FIG. 3 is a fragmentary isometric view of the cable connection circuit showing capacitors thereof.

With reference to FIGS. 2, 3, and 4, the cable connection circuit 20 is fabricated on a stripline support 76 comprising the aforementioned plate 68 covered with the bottom sheet 66 and also with an electrically conductive top sheet 78 (shown in FIG. 3). Portions of the top sheet 78 have been removed, in the view of FIG. 3, to create microstrip components at various locations on the support 76, the construction of the microwave coupler 32 (FIGS. 2 and 4) being an example of such microstrip construction. Both the top sheet 78 and the bottom sheet 66 are employed as ground planes for the circuit 20. The inductors and capacitors set forth in FIG. 1 are identified also in FIG. 2, FIG. 2 showing the specific locations of the inductors and the capacitors on the support 76. The coupler 32 extends a distance of one-quarter of the wavelength of the electromagnetic signal passing through the coupler. In the low-pass section 24, all of the capacitors C1–C4 are formed as flat plates disposed on the top sheet 78, and spaced apart therefrom by a layer 80 of dielectric material. Similarly, the capacitor C7 and C10 of the high pass section 26 are formed as flat plates disposed upon the top sheet 78 and separated therefrom by the dielectric layer 80. In the high pass section 26, the capacitors C5, C6, C8, C9, and C17 are formed by strips 82 of electrically conductive material which are spaced apart from each other and are disposed upon the dielectric layer 80, the latter being disposed upon sections of the top sheet 78, indicated in FIG. 3 by the legends 78A and 78B, which are spaced apart from each other.

To facilitate explanation of the construction of the foregoing capacitors, FIG. 3 shows a fragmentary view of the circuit 20 located on a corresponding fragmentary portion of the support 76. By way of example, portions of the capacitors C4 and C7 are shown. Each of the capacitors C4 and C7 comprise an upper plate 84 located above a portion of the top sheet 78 and separated therefrom by the dielectric layer 80. As shown in FIG. 1, both of the capacitors C4 and C7 are connected to ground and, accordingly, the top sheet 78 serves as this ground.

Also shown, by way of example in FIG. 3, is the construction of the capacitors C6 and C8 of the high pass section 26 of the diplexer 22 (FIG. 1), this form of construction applying also to the capacitors C5, C9, and C17 of the diplexer 22. In the neighborhood of the capacitors C6 and C8, the top sheet 78 has been etched away to leave only portions 78A and 78B of the top sheet, the portions 78A and 78B being spaced apart from each other by a gap 86. A center one of the strips 82, identified as strip 82A, is disposed above the gap 86, and separated therefrom by the dielectric layer 80. The strip 82A is separated on the right, from a strip 82 by a gap 88. The strip 82A is separated, on its left, from a further strip 82B by a gap 90. In this form of construction of the capacitor C8, the capacitor C8 is actually formed as a series combination of two intermediate capacitors C8' and C8". The intermediate capacitor C8'0 is formed between a right hand portion of the strip 82A and a left hand portion of the top sheet section 78B, while the intermediate capacitor C8" is formed between the left hand portion of the strip 82 and a right hand portion of the top sheet section 78B. In this arrangement of the series connection of the two intermediate capacitors C8' and C8", the electrical connection between the two capacitors is formed by the common top sheet section 78B. Similar construction is employed for the capacitor C6 wherein, to the left of the gap 90, the strip 82B and the sheet section 78A provide one of the intermediate capacitors, and to the right of the gap 90, the left portion of the strip 82A in conjunction with the right portion of the sheet section 78A form the second intermediate capacitor.

By employing the foregoing form of construction of the capacitors C6 and C8 to the entire series of capacitors C5, C6, C8, C9, and C17 of the high pass section 26 (shown in FIG. 2), there is established, in essence, a length of transmission line by which a signal from the terminal NW propagates a significant distance along the support 76. This enables a locating of the coupler 32 at a substantial distance from the terminal NW. As a result, as may be seen by examination of FIG. 2, all of the inductors L1–L6 of the low-pass section 24 are separated from the coupler 32 by components of the high-pass section 26, as well as the transformers T1 and T2 of the combiner 26 and by the relay 36.

It is noted also that the arrangement of the capacitors C1–C4 of the low pass section 24, and of the capacitors C5–C10 and C17 of the high pass section 26, isolates electrically the operation of the low pass section 24 from the high pass section 26 in that no more than fringing fields of the capacitors of one of the diplexer sections can reach the other section of the diplexer 22. In addition, the elongated structural configuration of the capacitors C5–C9 enables construction of the circuit 20 with a substantial spacing between the inductors of the high-pass section 26 and the inductors of the low-pass section 24.

By way of example the use of the cable connection circuit 20, incoming signals via the high-pass filter section 26 (FIG. 1) extend over a frequency band of 54–750 MHz (megahertz), with an upper portion of the band in the range of 700–750 MHz being employed for incoming telephone communication for the terminal RX. In the filter assembly 40, the high pass filter 72 has a low frequency stop band beginning at 552 MHz and extending to lower frequencies. Outgoing signals propagating via the low pass filter section 24 extend over a frequency band of 5–40 MHz, of which band a lower frequency portion extends from 5–40 MHz to be utilized by the outgoing telephone signals from the terminal TX. Each of the relays 36 and 38 is constructed in a mechanical bistable configuration wherein the state of the relay is maintained when deenergized and, wherein, upon being activated by a signal to its coil (not shown), switches to the desired position after which no further electrical input is required to maintain the relay in the desired position. This is useful for Pay-TV services wherein the incoming television as well as the outgoing interactive aspects may be made available only upon a paying of a fee.

In accordance with a feature of the invention, a compact configuration for the cable connection circuit 20 is obtained by bending the linear configuration of the low pass filter section 24 so that the end filter stage 52 is located adjacent to the front filter stage 46. FIG. 1 shows that the low pass filter section 24 can be constructed in an elongated format wherein the second filter stage 48 follows the first filter stage 46, and wherein the subsequent filter stages 50 and 52 follow in a continuing series after the filter section 48. With respect to the schematic depiction of the circuit in FIG. 1, the capacitor C1 of the end stage 52 is at a distance from the capacitor C4 of the first stage 46, and the inductors L1 and L2 of the end filter stage 52 are at a distance from the inductor L6 of the first filter stage 46. However, in accordance with the invention, the physical embodiment of the circuit, as shown in FIG. 2, is accomplished by placing the capacitor C1 of the end stage 52 adjacent to the capacitor C4 of the first stage 46. As a result of this aspect of bending the circuit configuration, the inductor L1 of the end stage 52 is located adjacent to the inductor L5 of the second filter stage 48.

In accordance with the invention, there is assurance that the close spacing of the components of the low pass filter section 24 does not introduce an excessive amount of coupling between the inductors, such as might derogate from the performance of the low pass filter section 24. This is accomplished by winding and orienting the inductors in a manner to reduce unwanted mutual coupling between the respective inductors. In the case of the inductors L3 and L5 which are oriented with their axes coaxial to a common axis or orientation, the coils L3 and L5 are wound in opposite directions of the common axis. For convenience in mounting and interconnecting the coils L3, L4, and L5, their common node of interconnection is provided at a mounting pad 92 (shown in FIG. 2) which is, in essence, a miniature capacitor in view of the mounting of the pad 92 upon the dielectric layer 80 (shown in FIGS. 2 and 3). The miniature capacitance of the pad 92 is not shown in the schematic of FIG. 1 because its capacitance is too small to have any appreciable effect on the performance of the circuitry of the diplexer 22.

At the junction of the three inductors L3, L4, and L5 at the pad 92, as shown in FIG. 2, the orientation of the inductor L4 is perpendicular to the orientation of each of the inductors L3 and L5. This reduces mutual inductive coupling between the inductors L4 and the inductors L3 and L5. With respect to the inductor L1, also shown in FIG. 2, its orientation is perpendicular to all three of the inductors L3, L4, and L5, this being accomplished by orienting the inductor L1 with its axis perpendicular to the plane of the stripline support 76. Thus, in the vicinity of the pad 92, there are four inductors, namely, the inductors L1, L3, L4 and L5, which, by virtue of the bending of the linear configuration of the low pass filter section 24, are in close proximity yet do not have excessive mutual coupling. The reduction of the mutual coupling is accomplished by virtue of the orientation of the inductor axes along three mutually perpendicular directions. In the case of the two inductors L3 and L5, wherein the axes are parallel, the individual coils of the inductors L3 and L5 are wound in opposite directions to counteract unwanted inductive coupling.

It is noted that, generally, the bending of the linear configuration of a filter section can be applied to both of the filter sections 24 and 26. However, in the construction of the preferred embodiment of the circuit 20, as depicted in FIG. 2, the emplacement of the relays 36 and 38 in the center of the stripline support 76 has made it beneficial to leave the high-pass filter section 26 in its linear configuration. In the event that the relays 36 and 38 were not required for the circuit 20, then the filter section 26 might also be bent as was accomplished for the filter section 24. It is noted also, that in the case wherein only one of the filter sections is to be bent, it is advantageous to apply the bending to the lower frequency filter section 24 because unwanted coupling among the filter components is lower at the lower frequency than at the higher frequency of the filter section 26. In the case of a bending of a higher frequency filter section, such as the section 26 wherein radiation is stronger, the physical sizes of the components are substantially smaller from those of the lower frequency filter section so that the mutual coupling coefficients are reduced. Therefore, the bending of a high pass filter section, such as the filter section 26, can be accomplished in accordance with the invention to provide for a reduction in the overall size of the circuit 20. It is noted also that, with respect to the coupling of electromagnetic fields among the various components of the circuit 20, the use of the microstrip configuration of the coupler 32 provides for a minimal amount of radiated electromagnetic fields. This results because of the cross-sectional configuration of the two conductors 62 and 64 being located in proximity to each other and to the bottom sheet 66, as depicted in FIG. 4.

Figure 5:
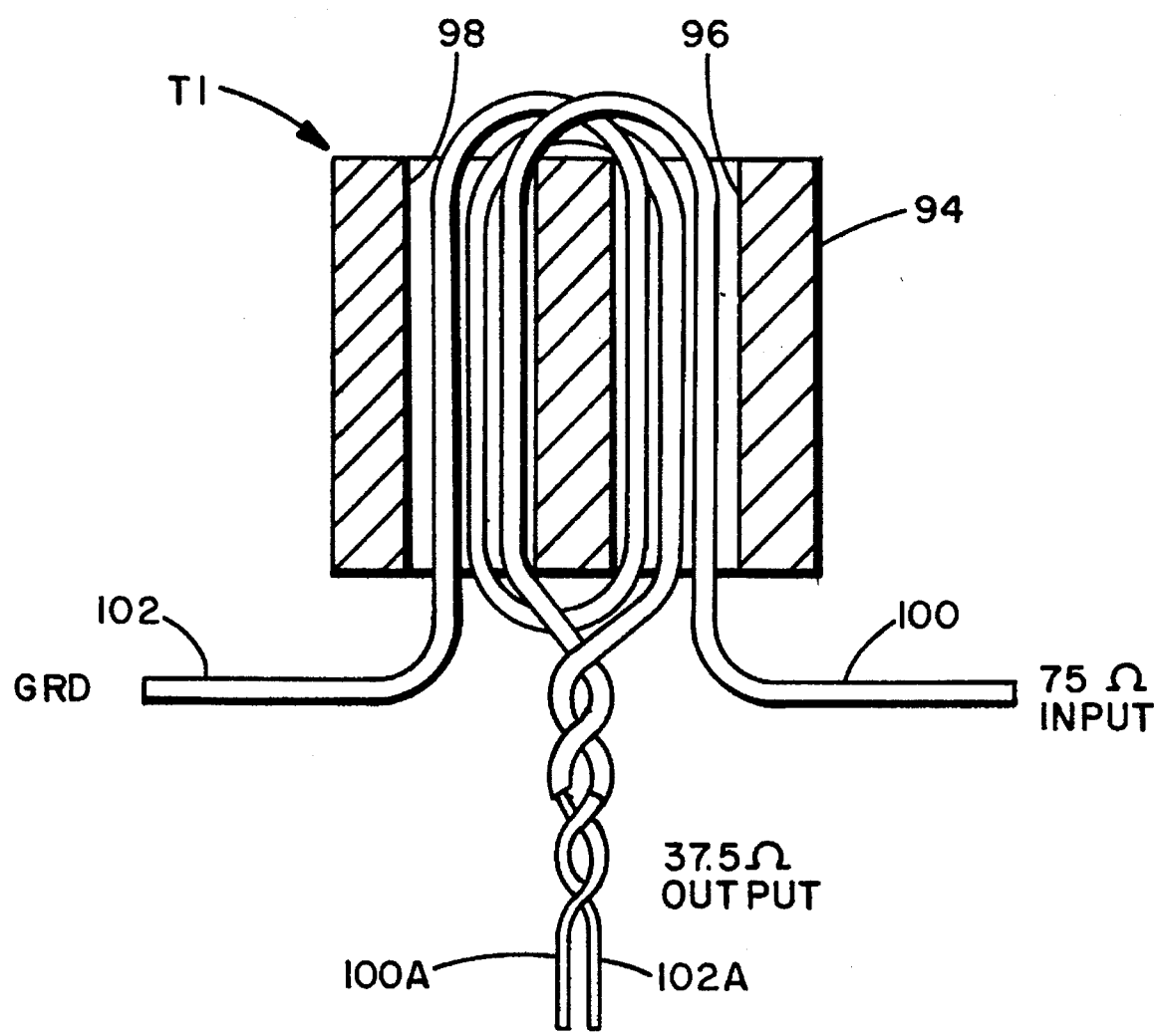
FIG. 5 is a sectional view, partly stylized, of a transformer used in construction of a power combiner of the cable connection circuit.

With respect to the construction of the combiner 28, each of the transformers T1 and T2 is constructed as shown in FIG. 5, wherein the construction of the transformer T1 is depicted, by way of example. The transformer T1 comprises a core 94 of magnetizable material, and has a generally cylindrical shape with two bores 96 and 98 through which are passed two wires 100 and 102 to form coils of the transformer T1. The wires 100 and 102 are insulated except at their ends 100A and 102A which are stripped of the insulation to provide for their connection. Connection of the two wire ends 100A and 102A forms the tap by which the transformer T1 is connected to the node 44 (FIG. 1). The winding provided by the wire 100 consists of one turn while the winding provided by the wire 102 consists of two turns, the wire 100 extending to the input line 30 and the wire 102 extending to ground. In the case of the transformer T2, the mode of construction follows that shown in FIG. 5 for T1 except that the number of turns of each of the wires is equal. Thus, the tap of the transformer T2 is a center tap.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A method of fabricating a diplexer for electromagnetic signals on a dielectric support plate within a region of the plate having dimensions less than approximately one-half wavelength of the shortest wavelength of said signals, the method comprising steps of:

providing a first filter on a first section of said plate, said plate being covered with a top electrically conductive sheet and a bottom electrically conductive sheet forming a stripline structure;

providing a second filter on a second section of said plate, and connecting each of said filters to a common terminal of the diplexer, said first section being separate from said second section, said first filter being operative to pass signals in a first part of the electromagnetic spectrum while attenuating signals in a second part of the electromagnetic spectrum, said second filter being operative to pass signals in the second part of the spectrum while attenuating signals in the first part of the spectrum;

wherein said step of providing said first filter includes a step of constructing said first filter of a series of filter stages having conductors and capacitors and being configured with an elongated configuration;

said step of providing said second filter includes a step of constructing said second filter of a series of filter stages having conductors and capacitors and being configured with an elongated configuration;

in each of said filters, inductors of consecutive ones of said series of filter sections are proximate each other while other ones of said inductors are distant from each other;

said method further comprises, in each of said filters, steps of forming each of said inductors by an electrically conductive wire wound about a core, said core extending along an axis of the core;

in each of said filters, forming each of a plurality of said capacitors as a laminate comprising an electrically conductive pad and a layer of dielectric material disposed between said pad and a portion of one of said sheets;

reducing a linear extent of said second filter by bending its linear configuration, said bending bringing a distant one of said inductors of said second filter into relative proximity to a group of proximate ones of said inductors of said second filter; and in said second filter, orienting said one distant inductor to bring its core axis into a perpendicular relationship to other inductors of said group of proximate inductors.

2. A method according to claim 1 further comprising a step of arranging all of the capacitors of said first and said second filters to be disposed on one side of said plate.

3. A method according to claim 1 further comprising a step of arranging all of the inductors of said first and said second filters to be disposed on one side of said plate.

4. A method according to claim 1 further comprising a step of locating the capacitors and the inductors of said first and of said second filters on one side of said plate, wherein said first filter passes signals at a frequency higher than a frequency of signals passed by said second filter, signals passed by said first filter are incoming signals to said common terminal of said diplexer, and signals passed by said second filter are outgoing signals which exit said diplexer via said common terminal.

5. A diplexer for electromagnetic signals comprising:

a dielectric support plate having a region for supporting the diplexer, the region having dimensions less than approximately one-half wavelength of the shortest wavelength of said signals;

a first filter located on a first section of said plate, said plate being covered with a top electrically conductive sheet and a bottom electrically conductive sheet forming a stripline structure;

a second filter located on a second section of said plate, each of said filters being connected to a common terminal of the diplexer, said first section of said plate being separate from said second section of said plate, said first filter being operative to pass signals in a first part of the electromagnetic spectrum while attenuating signals in a second part of the electromagnetic spectrum, said second filter being operative to pass signals in the second part of the electromagnetic spectrum while attenuating signals in the first part of the electromagnetic spectrum;

wherein said first filter comprises a series of filter stages having inductors and capacitors, and is configured with an elongated configuration;

said second filter comprises a series of filter stages having inductors and capacitors, and is configured with an elongated configuration;

in each of said filters, inductors of consecutive ones of said stages are proximate with each other while other ones of said inductors are distant from each other;

in each of said filters, each of said inductors comprises an electrically conductive wire wound about a core, said core extending along an axis of the core;

in each of said filters, each of a plurality of said capacitors comprises a laminate of an electrically conductive pad and a layer of dielectric material disposed between said pad and a portion of one of said sheets;

the linear configuration of said second filter is bent to bring a distant one of said inductors of said second filter into relative proximity to a group of proximate ones of said inductors with a consequent reduction in linear extent of said second filter; and in said second filter, said one distant inductor is oriented to provide a perpendicular relationship between a core axis of said one distant inductor and other inductors of said group of proximate inductors.

6. A diplexer according to claim 5 wherein all of the capacitors of said first and said second filters are disposed on one side of said plate.

7. A diplexer according to claim 5 wherein all of the inductors of said first and said second filters are disposed on one side of said plate.

8. A diplexer according to claim 5 wherein said first filter passes signals at a frequency higher than a frequency of signals passed by said second filter, the capacitors and the inductors of said first and said second filters are arranged on the same side of said plate, and signals passed by said first filter are incoming signals to said common terminal of the diplexer, and signals passed by said second filter are outgoing signals to be outputted from said common terminal of the diplexer.

* * * * *